US008164504B2

(12) United States Patent
Cho et al.

(10) Patent No.: US 8,164,504 B2
(45) Date of Patent: Apr. 24, 2012

(54) SUCCESSIVE APPROXIMATION REGISTER ANALOG-DIGITAL CONVERTER AND METHOD FOR OPERATING THE SAME

(75) Inventors: Young Kyun Cho, Daejeon (KR); Young Deuk Jeon, Daejeon (KR); Jae Won Nam, Daejeon (KR); Jong Kee Kwon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 55 days.

(21) Appl. No.: 12/882,421

(22) Filed: Sep. 15, 2010

(65) Prior Publication Data

US 2011/0227774 A1    Sep. 22, 2011

(30) Foreign Application Priority Data

Mar. 16, 2010    (KR) .................. 10-2010-0023159

(51) Int. Cl.
*H03M 1/12*    (2006.01)
(52) U.S. Cl. .................. 341/172; 341/118; 341/163
(58) Field of Classification Search .................. 341/163, 341/172
See application file for complete search history.

(56) References Cited

U.S. PATENT DOCUMENTS

| | | | |
|---|---|---|---|
| 5,684,487 A * | 11/1997 | Timko | 341/172 |
| 6,424,276 B1 | 7/2002 | Muñoz et al. | |
| 6,486,806 B1 | 11/2002 | Munoz et al. | |
| 6,587,066 B1 * | 7/2003 | Somayajula | 341/172 |
| 6,894,627 B2 | 5/2005 | Janakiraman et al. | |
| 7,218,259 B2 * | 5/2007 | Hurrell et al. | 341/118 |
| 7,342,530 B2 | 3/2008 | Kuttner | |
| 7,528,761 B2 | 5/2009 | Draxelmayr | |
| 7,605,741 B2 * | 10/2009 | Hurrell | 341/163 |
| 2004/0227652 A1 | 11/2004 | Draxelmayr | |
| 2007/0075884 A1 | 4/2007 | Melanson et al. | |
| 2008/0001804 A1 | 1/2008 | Draxelmayr | |
| 2008/0084340 A1 | 4/2008 | Hurrell | |

FOREIGN PATENT DOCUMENTS

KR    10-2002-0014522 A    2/2002
WO    WO 2007/021600 A1    2/2007

OTHER PUBLICATIONS

Vito Giannini et al., "An 820µW 9b 40MS/s Noise-Tolerant Dynamic-SAR ADC in 90nm Digital CMOS", 2008 IEEE International Solid-State Circuits Conference, Feb. 5, 2008, pp. 238-239, 610, IEEE.
Franz Kuttner, "A 1.2V 10b 20MSample/s Non-Binary Successive Approximation ADC in 0.13µm CMOS", 2002 IEEE International Solid-State Circuits Conference, Feb. 5, 2002, IEEE, 8 pages.
Shuo-Wei Michael Chen et al., "A 6-bit 600-MS/s 5.3-mW Asynchronous ADC in 0.13-µm CMOS",IEEE Journal of Solid-State Circuits, Dec. 2006, pp. 2669-2680, vol. 41, No. 12, IEEE.

* cited by examiner

Primary Examiner — Khai M Nguyen

(57) ABSTRACT

A successive approximation resistor analog digital converter (SAR ADC) includes a first conversion unit including a correction capacitor array and a bit capacitor array $2^{V-1}$ less than the number of a bit, a second conversion unit configured to differentially operate with the first conversion unit, a comparator configured to output a voltage of a high level or a low level of each capacitor according to output voltages of the first and second conversion units, a successive approximation register (SAR) logic unit configured to receive an output voltage of the comparator to convert the received output voltage into a digital signal, and a correction logic unit configured to receive the digital signal converted by the SAR logic unit and to correct a digital signal of the bit capacitor array using a correction digital signal of the correction capacitor array of the received digital signal.

14 Claims, 4 Drawing Sheets

FIG. 2A

| Original Code | | | | | | Calibration Function |
|---|---|---|---|---|---|---|
| Code | D2 | D1 | D0 | R1 | R0 | |
| Ideal case 1 | 0 | 1 | 0 | 0 | 1 | No error |
| @R1 error | 0 | 1 | 0 | 1 | 1 | No calibraion |
| @D0 error | 0 | 1 | 1 | 0 | 1 | D<2:0> -1 |
| @D1 error | 0 | 0 | 1 | 1 | 1 | D<2:0> +1 |

| D0 | | R1 | R0 |
|---|---|---|---|
| 1 | +1 | 1 | 1 |
| | -1 | 0 | 1 |

FIG. 2B

| Original Code | | | | | | Calibration Function |
|---|---|---|---|---|---|---|
| Code | D2 | D1 | D0 | R1 | R0 | |
| Ideal case 1 | 0 | 1 | 1 | 1 | 0 | No error |
| @R1 error | 0 | 1 | 1 | 0 | 0 | No calibraion |
| @D0 error | 0 | 1 | 0 | 1 | 0 | D<2:0> +1 |
| @D1 error | 1 | 0 | 0 | 0 | 0 | D<2:0> -1 |

| D0 | | R1 | R0 |
|---|---|---|---|
| 0 | +1 | 1 | 0 |
| | -1 | 0 | 0 |

FIG. 3

| Nth code | Original Code | Redundant bit D0 | Redundant bit R1 | Redundant bit R0 | Calibrated Code |
|---|---|---|---|---|---|
| 1 | 502 | 0 | 0 | 1 | 502 |
| 2 | 7 | 1 | 1 | 1 | 8 |
| 3 | 494 | 0 | 0 | 0 | 494 |
| 4 | 21 | 1 | 1 | 0 | 21 |
| 5 | 477 | 0 | 1 | 0 | 477 |
| 6 | 42 | 1 | 0 | 0 | 42 |
| 7 | 451 | 1 | 1 | 0 | 451 |
| 8 | 71 | 0 | 0 | 1 | 71 |
| 9 | 418 | 1 | 0 | 1 | 418 |
| 10 | 109 | 0 | 1 | 0 | 109 |
| 11 | 379 | 1 | 1 | 1 | 378 |
| 12 | 151 | 0 | 0 | 0 | 151 |
| 13 | 334 | 1 | 1 | 0 | 334 |
| 14 | 197 | 0 | 0 | 1 | 197 |
| 15 | 286 | 1 | 0 | 0 | 286 |
| 16 | 246 | 0 | 1 | 1 | 246 |
| 17 | 238 | 1 | 0 | 1 | 238 |
| 18 | 295 | 0 | 1 | 0 | 295 |
| 19 | 190 | 1 | 1 | 1 | 190 |
| 20 | 342 | 0 | 0 | 0 | 342 |
| 21 | 144 | 1 | 1 | 1 | 144 |
| 22 | 385 | 0 | 0 | 0 | 385 |
| 23 | 102 | 1 | 0 | 1 | 102 |
| 24 | 424 | 0 | 1 | 1 | 424 |
| 25 | 67 | 1 | 1 | 0 | 67 |
| 26 | 456 | 0 | 0 | 1 | 456 |
| 27 | 38 | 1 | 0 | 1 | 38 |
| 28 | 481 | 0 | 1 | 1 | 481 |
| 29 | 18 | 1 | 1 | 0 | 18 |
| 30 | 496 | 0 | 0 | 1 | 496 |
| 31 | 7 | 1 | 1 | 0 | 7 |
| 32 | 502 | 0 | 0 | 0 | 503 |
| 33 | 5 | 1 | 1 | 1 | 5 |
| 34 | 500 | 0 | 0 | 0 | 500 |
| 35 | 13 | 1 | 1 | 1 | 13 |
| 36 | 487 | 0 | 1 | 0 | 487 |
| 37 | 30 | 1 | 0 | 1 | 30 |
| 38 | 465 | 0 | 0 | 0 | 465 |
| 39 | 56 | 1 | 1 | 1 | 56 |
| 40 | 436 | 0 | 0 | 0 | 436 |
| 41 | 90 | 1 | 1 | 1 | 90 |
| 42 | 399 | 0 | 0 | 0 | 399 |
| 43 | 127 | 1 | 1 | 1 | 128 |
| 44 | 357 | 0 | 0 | 0 | 357 |
| 45 | 174 | 1 | 1 | 1 | 174 |
| 46 | 311 | 0 | 0 | 0 | 311 |
| 47 | 222 | 1 | 1 | 1 | 221 |
| 48 | 262 | 0 | 0 | 0 | 262 |
| 49 | 270 | 1 | 1 | 1 | 270 |
| 50 | 213 | 0 | 0 | 0 | 213 |
| 51 | 318 | 1 | 1 | 1 | 318 |
| 52 | 166 | 0 | 0 | 0 | 166 |
| 53 | 364 | 1 | 1 | 1 | 364 |
| 54 | 122 | 0 | 0 | 0 | 122 |
| 55 | 406 | 1 | 1 | 1 | 406 |
| 56 | 83 | 0 | 0 | 0 | 87 |
| 57 | 441 | 1 | 1 | 1 | 441 |
| 58 | 51 | 0 | 0 | 0 | 51 |
| 59 | 469 | 1 | 1 | 1 | 469 |
| 60 | 27 | 0 | 0 | 0 | 27 |
| 61 | 489 | 1 | 1 | 1 | 490 |
| 62 | 11 | 0 | 0 | 0 | 11 |
| 63 | 500 | 1 | 1 | 1 | 500 |
| 64 | 5 | 0 | 0 | 0 | 5 |
| SNDR | 51.18 | ⇒ | calibration | | 53.7346 |
| ENOB | 8.2094 | ⇒ | calibration | | 8.6337 | for 9bit DAC

US 8,164,504 B2

SUCCESSIVE APPROXIMATION REGISTER ANALOG-DIGITAL CONVERTER AND METHOD FOR OPERATING THE SAME

CROSS-REFERENCE TO RELATED APPLICATION

This application claims priority to and the benefit of Korean Patent Application No. 10-2010-0023159, filed Mar. 16, 2010, the disclosure of which is incorporated herein by reference in its entirety.

BACKGROUND

1. Field of the Invention

The present invention relates to a method of correcting an error code generated during an operation of a successive approximation register analog-digital converter (SAR ADC), and more specifically, to an SAR ADC having a wide dynamic operation range and a high signal-to-noise ratio.

2. Discussion of Related Art

In recent years, successive approximation register analog-digital converters (SAR ADCs) having a resolution of 8 to 16 bits and a conversion speed of 5 to 100 MS/s have drawn attention. Furthermore, the SAR ADCs are emerging as a candidate for a next generation high efficiency data converter due to low power consumption. Despite these advantages of the SAR ADC, since these SAR ADCs use a method of finding a digital output value as close as possible to an input by fixing the input and sequentially varying a reference voltage, there is no method of correcting errors generated during the operation. Due to characteristics of the SAR ADC, most SAR DAC circuits have used a digital error correction method.

There is a method of correcting an error of a conventional SAR ADC through an algorithm using multiple components including a capacitor array consisting of $R^N$ (R<2), a linear feedback shift register (LFSR), a memory, a comparison bit generator, etc. However, when the error of the SAR ADC is corrected through the above method, a capacitor mismatch characteristic is degraded by a non-binary capacitor array, and it is difficult to embody the SAR ADC due to the complicated correction algorithm.

Further, conventional SAR ADCs dispose one redundant bit and correct an error generated in an upper code of the redundant bit. However, although the error correction method using the redundant bit can correct the error in the upper code of the redundant bit, it is impossible to correct an error in a lower code of the redundant bit. Accordingly, there is a demand for circuit techniques compensating for this problem.

SUMMARY OF THE INVENTION

The present invention is directed to correcting a digital code finally output from a successive approximation register analog-digital converter (SAR ADC) by determining the least significant bit (LSB) and then determining the LSB again and an inversion of the LSB by an additional unit capacitor. The SAR ADC embodied using the correction method can minimize various dynamic noise effects such as glitch, power supply variation, etc. generated during operations to obtain an improved static characteristic and can accordingly realize a high signal-to-noise ratio.

One aspect of the present invention provides an SAR ADC including: a first conversion unit having a correction capacitor array and a bit capacitor array $2^{\nu-1}$ less than the number of a bit; a second conversion unit configured to differentially operate with the first conversion unit; a comparator configured to output a voltage of a high level or a low level of each capacitor according to output voltages of the first and second conversion units; a successive approximation register (SAR) logic unit configured to receive an output voltage of the comparator to convert the received output voltage into a digital signal; and a correction logic unit configured to receive the digital signal converted by the SAR logic unit and to correct a digital signal of the bit capacitor array using a correction digital signal of the correction capacitor array of the received digital signal. Here, after an input analog signal is sampled, outputs of the first and second conversion units are connected to input terminals of the comparator to determine a digital value corresponding to the most significant bit (MSB) according to the output voltage of the comparator.

Another aspect of the present invention provides a method of operating an SAR ADC including a bit capacitor array and first and second correction capacitors, including: sampling an input analog voltage of the bit capacitor array; determining a digital value of "0" or "1" of a bit corresponding to the most significant bit (MSB); determining digital values of "1" or "0" from a bit capacitor corresponding to a bit next to the MSB to the bit capacitor corresponding to the LSB by carrying out a successive approximation operation; determining digital values of "1" or "0" of the first and second correction capacitors according to the digital value corresponding to the LSB by the successive approximation operation without driving the bit capacitor corresponding to the LSB; and correcting the digital values of the bit capacitors according to the digital values of the first and second correction capacitors.

BRIEF DESCRIPTION OF THE DRAWINGS

The above and other features and advantages of the present invention will become more apparent to those of ordinary skill in the art by describing in detail exemplary embodiments thereof with reference to the attached drawings in which:

FIGS. 2A and 2B are graphs illustrating an error correction algorithm according to exemplary embodiment of the present invention;

FIG. 3 is a graph illustrating a circuit embodied-simulation result according to an exemplary embodiment of the present invention.

DETAILED DESCRIPTION OF EMBODIMENTS

Figure 1A:
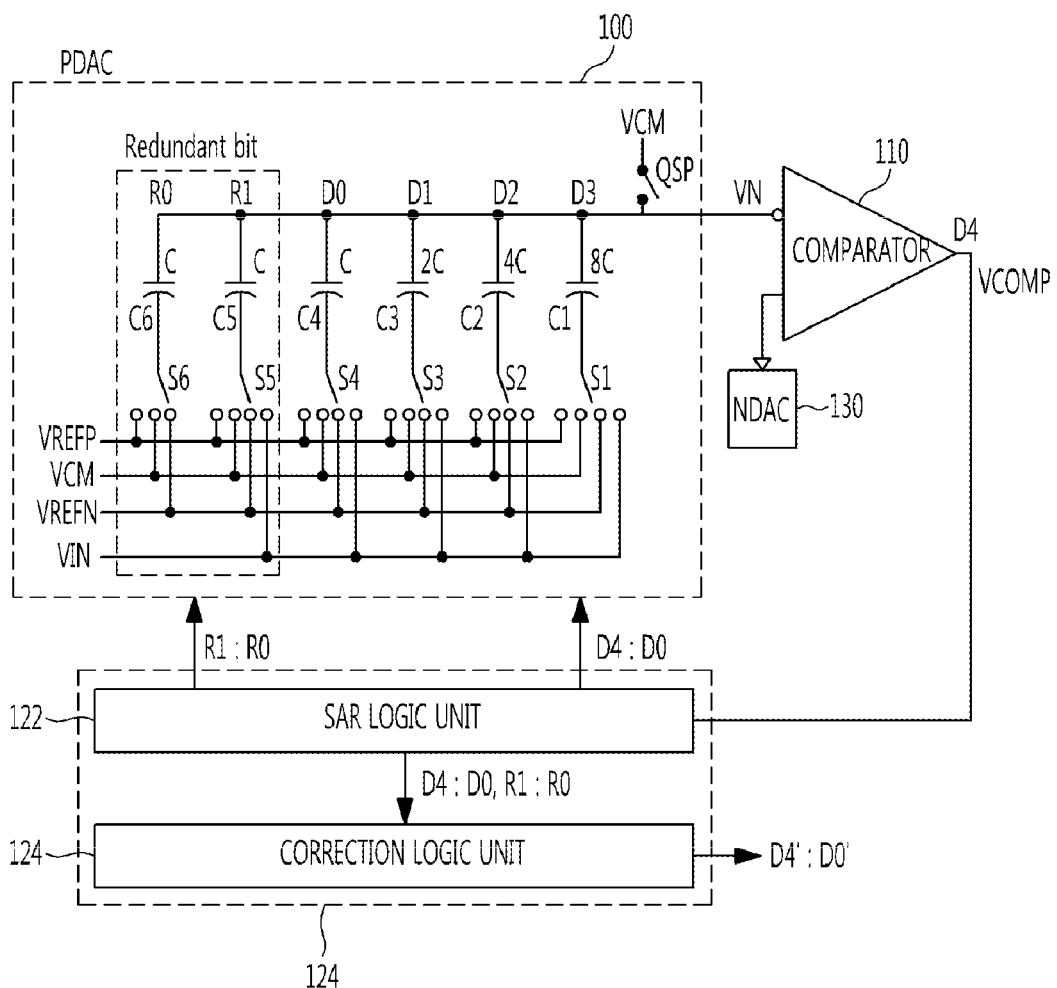
FIG. 1A is a plan view of a successive approximation register analog-digital converter (SAR ADC) according to an exemplary embodiment of the present invention.

The present invention will be described more fully hereinafter with reference to the accompanying drawings, in which exemplary embodiments of the invention are shown. This invention may, however, be embodied in different forms and should not be construed as limited to the embodiments set forth herein. In drawings, portions unrelated to description will be omitted to distinctly describe the present invention and similar reference numerals are labeled to similar portions throughout the specification.

FIG. 1 is a plan view explaining a successive approximation register analog-digital converter (SAR ADC) according to an exemplary embodiment of the present invention.

Referring to FIG. 1, an SAR ADC includes a first conversion array 100, a comparator 110, a controller 120 and a second conversion array 130 which is a negative digital-analog converter (NDAC). The controller 120 includes an SAR logic unit 122 and a correction logic unit 124.

Herein, although the SAR DAC having 5-bit resolution is illustrated for clarity, the present invention may be used in all high resolution SAR ADCs and low resolution SAR ADCs. Further, although the DAC of the present invention is constructed using a binary weighted capacitor array (BWC) for clarity, the DAC of the present invention may be constructed using a split capacitor or a resistor and an SAR ADC using a unit capacitor array in the same manner.

The first conversion array 100 which is a positive digital-analog converter (PDAC) includes a correction capacitor array and a bit capacitor array $2^{(N-1)}$ less than the number of bits, wherein N denotes the resolution. For example, the first conversion array 100 may be configured to include 4 capacitors C1 to C4 corresponding to the resolution of 4 bits of 5 bits and correction capacitors C5 and C5. Herein, six capacitors C1 to C6 included in the first conversion array have top plates which are connected to a first input terminal VN of the comparator 110 and bottom plates which are selectively connected to a first reference voltage VREFP, a second reference voltage VREFN, an input analog voltage VIN or a common mode voltage VCM via switches S1 to S6. The common mode voltage VCM is typically (VREFP+VREFN)/2.

Four capacitors C1 to C4 are defined according to a bit 2(N−1) less than a total bit number from the least significant bit (LSB) to a bit next to the most significant bit (MSB). The first capacitor C1 corresponding to the bit next to the MSB is 8C and the second capacitor C2 corresponding to next bit is 4C. In this manner, the fourth capacitor C4 corresponding to the LSB is C. The correction capacitors C5 and C6 have the same capacitance as the fourth capacitor C4 corresponding to the LSB.

The second conversion array 130, which is the NDAC and connected to a second input terminal of the comparator 110, is a circuit which differentially operates with the first conversion array 100. The second conversion array 130 has the same construction as the first conversion array 100. Six capacitors are connected to the second input terminal of the comparator 110 and a power connection is the reverse.

The comparator 110 has the first input terminal VN, the second input terminal and an output terminal. The comparator 110 outputs an output voltage VCOMP of a high level or a low level to the SAR logic unit 122 of the controller 120 according to a differential voltage between a voltage of the first input terminal VN and a voltage of the second input terminal.

The controller 120 includes the SAR logic unit 122 and the correction logic unit 124.

The SAR logic unit 122 receives the output voltage VCOMP of the comparator 110 to convert the received output voltage into a digital signal. In particular, the SAR logic unit 122 establishes digital signals D0:D4 and R1:R0 into a high level or a low level to control the respective switches S1 to S6 of the respective capacitors C1 to C6 and provides the digital signals D0:D4 and R1:R0 to the switches S1 to S6. Further, the SAR logic unit 122 receives the output voltage VCOMP from the comparator 110 to convert the received output voltage into the digital signal, and provides the digital signal to the correction logic unit 124.

The correction logic unit 124 receives the digital signals D4:D0 into which the input analog voltage VIN is converted and the correction digital signals R1:R0 converted in the correction capacitors C5 and C6 from the SAR logic unit 122. Further, the correction logic unit 124 corrects the digital signals D4:D0 according to the received correction digital signals R1:R0 to output finial digital signals D4':D0'. That is, the correction logic unit 124 receives the digital signals converted by the SAR logic unit 122, and corrects and outputs the digital signal of the bit capacitor array using the correction digital signals of the correction capacitor array of the received digital signals.

The first to fifth capacitors C1 to C5, except for the sixth capacitor C6, represented as a redundant bit illustrated in FIG. 1A have the same arrangement as a conventional DAC structure.

Figure 1B:
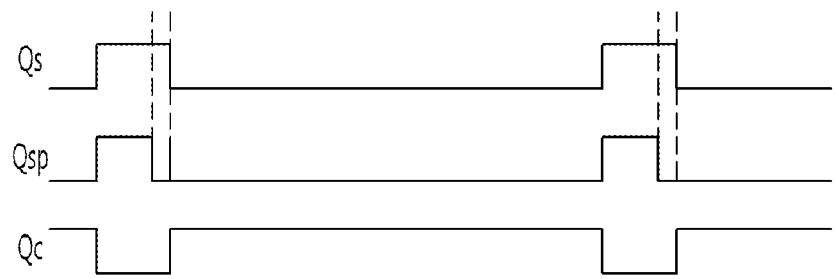
FIG. 1B is a graph illustrating an error correction method of an SAR ADC according to an exemplary embodiment of the present invention.

FIG. 1B is a graph illustrating an error correction method of an SAR ADC according to an exemplary embodiment of the present invention. To adapt the error correction method according to the exemplary embodiment, first, at a sampling phase Qs, the top plates of the first to sixth capacitors C1 to C6 of the first conversion array 100 are connected to the common mode voltage VCM. In addition, the bottom plates of the first to fifth capacitors C1 to C5 are connected to the positive input analog voltage VIN, and the bottom plate of the sixth capacitor C6 is connected to the common mode voltage VCM. On the other hand, the top plate of the capacitor array of the second conversion array 130 is connected to the common mode voltage VCM and the bottom plate of the capacitor array is connected to a negative analog input voltage VINB so that the analog input voltage is stored in the capacitors. Herein, the sixth capacitor C6 is connected to the common mode voltage VCM so as not to affect the operation of the circuit.

If the sampling is terminated by a prime signal Qsp of the sampling phase Qs, the switches S1 to S6 connected to the bottom plates of the capacitors C1 to C6 are connected to the common mode voltage VCM and the top plates of the capacitors C1 to C6 are connected to the input terminal of the comparator 110. If this operation is represented by equation, after the sampling is terminated, a voltage difference Vx between the input terminals of the comparator 110 becomes −Vin (=VIN−VINB). The comparator 110 compares whether the input voltage is larger or smaller than zero (0) to determine the MSB.

In the case of the conventional SAR ADC, after sampling, an input switch is connected to a second reference voltage VREFN to carry out an operation that determines a first bit. However, to reduce the number of capacitors, a method of connecting the input switch to the common mode voltage VCM following the sampling has been used. This method can directly obtain an output of the first bit from the comparator, after the sampling. Accordingly, the number of capacitors corresponding to 1 bit can be reduced.

However, the method additionally requires a reference voltage for the common mode voltage.

The SAR ADC of the exemplary embodiment operates by using a structure that connects to the common mode voltage VCM, after sampling, such that it maximizes the effect of the following error correction by additional capacitor arrangement.

The following operation is the same as the conventional SAR ADC. First, the comparator compares the sampled value to output the digital code of D4 which switches the bottom plate of the first capacitor C1. That is, the bottom plate of the first capacitor C1, which has been connected to the common mode voltage VCM, is changed to the second reference voltage VREFN or the first reference voltage VREFP according to the value of D4. The successive approximation operation is continuously carried out until the D0 code is determined. After the D0 code is determined, the error correction according to the exemplary embodiment starts.

First, the code of R1 is determined under the same condition as the determination of the D1 code. That is, a value of the D0 code is not used to drive the switch connected to the fifth capacitor C5. Due to this, the R1 code is compared with the voltage having the same level as the D0 code again. Accordingly, under the ideal condition, the value of the R1 code must be equal to the value of the D0 code. The switch connected to the bottom plate of the fifth capacitor C5 operates according to the determined value of the R1 code. In the ideal case, after the LSB is determined, the difference between the input voltages compared in the input terminals of the comparator comes within 1 LSB. Accordingly, in the case where it switches using the capacitor having the same size once more, that is, in the case where it switches the fifth capacitor C5 by the R1 code, the output code R0 must have an inverted value. That is, if the value of the R1 code is "1," the value of the R0 code must be represented as "0" and if the value of the R1 code is "0," the value of the R0 code must be represented as "1."

In other words, in the ideal case where there is no external noise source, the bits which are obtained by using the capacitor arrangement as described above and adding the additional capacitors suggested in the present invention have the following characteristics.

$$D0=R1 \neq R0 \quad (1)$$

FIGS. 2A and 2B are graphs illustrating the number of cases that the D0/R0/R1 codes can have according to an exemplary embodiment.

First, referring to FIG. 2A, in the ideal case, D0 and R1 codes have the values of "0" (D0=0=R1) and R0 code has the value of "1." If the value of the D0 code is not equal to the value of the R1 code and the R0 code has as an inverted value of the D0 code as an output result, it is regarded that an error due to an undesired error source has occurred (@ R1 error case), when it determines the R1 code. Because the error has occurred in the R1 code, no corrections are required. Furthermore, if the value of the code D0 is determined as "1," the values of the R1 code and the R0 code are "1," because the R1 code and the R0 code are output without error, and the error is regarded as having been generated in the D0 code (@ D0 error case). Accordingly, because the expected value of the code D0 is "0", the error is corrected through the process that subtracts "1" from an original code. Finally, if all the values of the D0, R1 and R0 codes are output as "1," it means that the input voltage difference is 1 LSB or more, after it calculates the LSB. This means that it increases the total codes by "1." Accordingly, in the case of D0=R1=R0=1, the error is corrected through the process that adds "1" to the original code.

FIG. 2B can be explained in the same manner as FIG. 2A and will be readily understood from the understandings of FIG. 2A. In other words, the correction logic unit determines that the error has occurred if the digital value of the first correction capacitor (mentioned above as the fifth capacitor C5) is equal to the digital value corresponding to the LSB and the value of the second correction capacitor (mentioned above as the sixth capacitor C6) is equal to an inverted value of the digital value corresponding to the LSB. Alternatively, the correction logic unit determines that the error has occurred in the digital value of the first correction capacitor C5 and uses the digital value corresponding to the LSB as it is, if the digital values of the first correction capacitor C5 and the second correction capacitor C6 are equal to an inverted value of the digital value corresponding to the LSB. Furthermore, if the digital value corresponding to the LSB, the digital value of the first correction capacitor C5 and the digital value of the second correction capacitor C6 are "1, 1, 1" or "0, 1, 0," respectively, it adds "1" to the total code value. If the values are "1,0,1" or "0,0,0," respectively, it subtracts "1" from the total code value.

Figure 4:
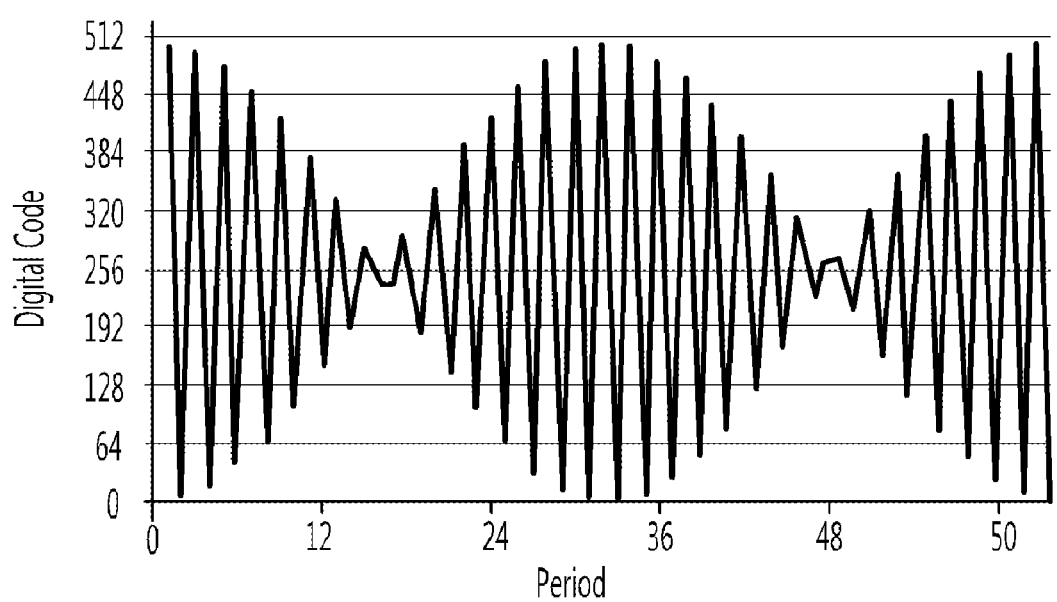
FIG. 4 is a waveform diagram illustrating a circuit embodied-simulation result according to an exemplary embodiment of the present invention.

FIG. 3 is a graph illustrating a simulation result according to an exemplary embodiment and FIG. 4 is a waveform diagram illustrating a simulation result according to an exemplary embodiment. Specifically, FIG. 3 is a graph illustrating the simulation result of the SAR ADC having 9-bit resolution embodied by the present invention. In general, the dynamic performance of an ADC is evaluated by applying a sine wave to an input, confirming whether the input is normally output as a digital output, and converting the codes into the FFT function. It is noted that the result for 64 periods is used to convert the output digital code into the FFT function and the digital code of the 9-bit digital ADC has the value between 0 (zero) and 512 as illustrated in FIG. 4. The original values of the waveform are illustrated in the left portion of FIG. 3 and the digital values corrected by the values of D0, R1, and R2 codes are comparatively illustrated in the right portion of FIG. 3.

It may be confirmed that the output digital values are output as the codes corrected by the method of adding "1" or subtracting "1" according to the values of the D0, R1 and R0 from the present invention. When a signal-to-noise-distortion ratio (SNDR) is calculated by the FFT, it is noted in the results that the SNDR is improved from 51.8 dB in the uncorrected code to the 53.7 dB in the corrected code. That is, the improvement of the effective number of bits (ENOB) from 8.2 bit to 8.63 by the error correction method suggested by the present invention can be confirmed.

The present invention provides the SAR ADC having various advantages by suggesting an error correction method of the SAR ADC. Particularly, if a digital output error of 1 LSB occurs, it can correct it by using 2 redundant bits which are the same as the LSB to increase a dynamic operation range of a signal converter and improve the signal-to-noise-distortion ratio (SNDR) of an output signal. If a code lower than an original code is output, it is almost impossible to correct the code error in the prior art. However, the present invention can correct the code error in all cases where the code is higher or lower than the original code. Furthermore, it can correct an error without a capacitor mismatching generated in a structure using radix of below 2 or complicated logic.

In the drawings and specification, there have been disclosed typical exemplary embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A successive approximation register analog digital converter (SAR ADC), comprising:
   a first conversion unit including a correction capacitor array and a bit capacitor array $2^{N-1}$ less than the number of bits;
   a second conversion unit configured to differentially operate with the first conversion unit;
   a comparator configured to output a voltage of a high level or a low level of each capacitor according to output voltages of the first and second conversion units;

a successive approximation register (SAR) logic unit configured to receive an output voltage of the comparator to convert the received output voltage into a digital signal; and a correction logic unit configured to receive the digital signal converted by the SAR logic unit and to correct a digital signal of the bit capacitor array using a correction digital signal of the correction capacitor array of the received digital signal, wherein after an input analog signal is sampled, outputs of the first and second conversion units are connected to input terminals of the comparator to determine a digital value corresponding to the most significant bit (MSB) according to the output voltage of the comparator.

2. The SAR ADC of claim 1, wherein the correction capacitor array is formed between any one of a common mode voltage, a first reference voltage and a second reference voltage and the input terminal of the comparator, and includes a first correction capacitor and a second correction capacitor.

3. The SAR ADC of claim 2, wherein the common mode voltage has an intermediate value of the first and second reference voltages.

4. The SAR ADC of claim 2, wherein the first correction capacitor calculates a value equal to a value of a capacitor corresponding to the LSB of the bit capacitor array.

5. The SAR ADC of claim 4, wherein the correction logic unit determines that no error has occurred when a digital value of the first correction capacitor is equal to the digital value corresponding to the LSB and a digital value of the second correction capacitor is equal to an inverted value of the digital value corresponding to the LSB.

6. The SAR ADC of claim 5, wherein the correction logic unit determines that an error has occurred in the digital value of the first correction capacitor and uses the digital value corresponding to the LSB as it is, when the digital values of the first and second correction capacitors are equal to the inverted value of the digital value corresponding to the LSB.

7. The SAR ADC of claim 6, wherein the correction logic unit adds "1" to a total code value when the digital value corresponding to the LSB and the digital values of the first and second correction capacitors are "1,1,1" or "0,1,0," respectively, and the logic correction unit subtracts "1" from the total code value, when the digital value corresponding to the LSB and the digital values of the first and second correction capacitors are "1,0,1" or "0,0,0," respectively.

8. A method of driving a successive approximation register analog digital converter (SAR ADC) including a bit capacitor array and first and second correction capacitors, comprising:
sampling an input analog voltage of the bit capacitor array;
determining a digital value of "0" or "1" of a bit corresponding to the most significant bit (MSB);
determining digital values of "1" or "0" from a bit capacitor corresponding to a bit next to the MSB to the bit capacitor corresponding to the LSB by carrying out a successive approximation operation;
determining digital values of "1" or "0" of the first and second correction capacitors according to the digital value corresponding to the LSB by the successive approximation operation without driving the bit capacitor corresponding to the LSB; and
correcting the digital values of the bit capacitors according to the digital values of the first and second correction capacitors.

9. The method of claim 8, wherein in the sampling, a bottom plate of the first correction capacitor is connected to the input analog voltage and a bottom plate of the second capacitor is connected to a common mode voltage.

10. The method of claim 9, wherein the common mode voltage has an intermediate value of first and second reference voltages.

11. The method of claim 10, wherein correcting the digital value of the bit capacitor includes determining that no error has occurred when the digital value of the first correction capacitor is equal to the digital value corresponding to the LSB and the digital value of the second correction capacitor is equal to an inverted value of the digital value corresponding to the LSB.

12. The method of claim 11, wherein correcting the digital value of the bit capacitor includes determining that an error is in the first correction capacitor and using the digital value corresponding to the LSB as it is when the digital values of the first and second correction capacitors are equal to the inverted value of the digital value corresponding to the LSB.

13. The method of claim 12, wherein correcting the digital value of the bit capacitor includes adding "1" to a total code value when the digital value corresponding to the LSB and the digital values of the first and second correction capacitors are "1,1,1" or "0,1,0," respectively and subtracting "1" from the total code value when the digital value corresponding to the LSB and the digital values of the first and second correction capacitors are "1,0,1" or "0,0,0," respectively.

14. The method of claim 8, wherein the SAR ADC further includes another bit capacitor array configured to reversely connect a power source as compared with the bit capacitor array and,
determining the digital value of "1" or "0" of the bit corresponding to the MSB includes determining an output of a comparator by connecting an output of the other bit capacitor array to which the power source is reversely connected as compared with the bit capacitor array to input terminals of the comparator.

* * * * *